(12) United States Patent
Kim et al.

(10) Patent No.: US 12,029,087 B2
(45) Date of Patent: Jul. 2, 2024

(54) FLEXIBLE DISPLAY DEVICE HAVING REDUCED STRAIN DURING BENDING OR ROLLING

(71) Applicant: Samsung Display Co., Ltd., Yongin-si (KR)

(72) Inventors: Minsung Kim, Hwaseong-si (KR); Hyunwoo Koo, Hwaseong-si (KR); Tae Woong Kim, Seongnam-si (KR); Jin Hwan Choi, Seoul (KR); Hayk Kachatryan, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 182 days.

(21) Appl. No.: 17/459,493

(22) Filed: Aug. 27, 2021

(65) Prior Publication Data

US 2021/0391410 A1 Dec. 16, 2021

Related U.S. Application Data

(62) Division of application No. 16/137,559, filed on Sep. 21, 2018, now Pat. No. 11,107,874.

(30) Foreign Application Priority Data

Jan. 12, 2018 (KR) .................. 10-2018-0004287

(51) Int. Cl.
*H10K 59/131* (2023.01)
*G06F 3/041* (2006.01)
(Continued)

(52) U.S. Cl.
CPC ....... *H10K 59/131* (2023.02); *G06F 3/04164* (2019.05); *G06F 3/044* (2013.01);
(Continued)

(58) Field of Classification Search
CPC ......... H10K 2102/311; H10K 2102/00; H10K 2101/00; H10K 59/131–1315
See application file for complete search history.

(56) References Cited

U.S. PATENT DOCUMENTS 9,730,318 B2 8/2017 Choi et al.
9,857,845 B2 1/2018 Hong et al.
(Continued)

FOREIGN PATENT DOCUMENTS

KR 10-2006-0110343 10/2006
KR 10-1013833 2/2011
(Continued)

OTHER PUBLICATIONS

Non-Final Office Action dated Jan. 27, 2020, issued in U.S. Appl. No. 16/137,559.
(Continued)

*Primary Examiner* — Laura M Menz
*Assistant Examiner* — Candice Chan
(74) *Attorney, Agent, or Firm* — KILE PARK REED & HOUTTEMAN PLLC

(57) ABSTRACT

A display device includes: a flexible substrate; a plurality of conductive lines on the flexible substrate; a thin film transistor connected to the plurality of conductive lines; and an organic light emitting element connected to the thin film transistor. As a curvature of an area of the flexible substrate increases, a width or a thickness of each of the conductive lines increases.

10 Claims, 13 Drawing Sheets

(51) Int. Cl.
*G06F 3/044* (2006.01)
*H10K 50/84* (2023.01)
*H10K 59/40* (2023.01)
*H10K 77/10* (2023.01)
*H10K 102/00* (2023.01)

(52) U.S. Cl.
CPC .......... *G06F 3/0446* (2019.05); *H10K 50/84* (2023.02); *H10K 59/40* (2023.02); *H10K 77/111* (2023.02); *G06F 2203/04102* (2013.01); *H10K 2102/311* (2023.02)

(56) References Cited

U.S. PATENT DOCUMENTS

| | | | |
|---|---|---|---|
| 10,727,282 | B2 | 7/2020 | Kim et al. |
| 2016/0054758 | A1 | 2/2016 | Han |
| 2016/0093644 | A1 | 3/2016 | Ki et al. |
| 2016/0105950 | A1 | 4/2016 | Drzaic et al. |
| 2016/0120023 | A1* | 4/2016 | Choi ............... H05K 1/028 |
| | | | 29/829 |

FOREIGN PATENT DOCUMENTS

| | | |
|---|---|---|
| KR | 10-2016-0022434 | 3/2016 |
| KR | 10-2017-0034998 | 3/2017 |
| KR | 10-2017-0128789 | 11/2017 |

OTHER PUBLICATIONS

Final Office Action dated Jun. 26, 2020, issued in U.S. Appl. No. 16/137,559.
Non-Final Office Action dated Oct. 7, 2020, issued in U.S. Appl. No. 16/137,559.
Notice of Allowance dated Apr. 30, 2021, issued in U.S. Appl. No. 16/137,559.
English machine Translation of KR10-2008-0066296 to Cannon Kabushiki Kaisha; Jan. 14, 2009.

* cited by examiner

FLEXIBLE DISPLAY DEVICE HAVING REDUCED STRAIN DURING BENDING OR ROLLING

CROSS-REFERENCE TO RELATED APPLICATION

This application is a Divisional of U.S. patent application Ser. No. 16/137,559, filed on Sep. 21, 2018, and claims priority from and the benefit of Korean Patent Application No. 10-2018-0004287, filed on Jan. 12, 2018, which is hereby incorporated by reference for all purposes as if fully set forth herein.

BACKGROUND

Field

Exemplary embodiments of the invention relate generally to a display device.

Discussion of the Background

In recent times, flexible display devices that are bendable are being developed. Such flexible display devices may be used in various fields because they may be used in a folded or curved form. The flexible display devices have a structure in which a display element is disposed on a flexible substrate.

Examples of the display elements that may be applicable to the flexible display devices may include organic light emitting diodes ("OLEDs"), liquid crystal display ("LCD") elements, electrophoretic display ("EPD") elements, or the like. Among these, OLEDs are attracting attention as display elements of such flexible display panels because they may be manufactured into a stack structure of a thin film type to have excellent flexibility.

Examples of the flexible display devices may include rollable display devices that can be rolled, foldable display devices that can be folded like paper, and stretchable display devices that can be scaled up and down, which may be classified according to their degree of flexion.

Such a flexible display device includes a substrate, various insulating layers formed on the substrate, and wirings including a conductive material. As the flexible display device is repeatedly bent, conductive lines included in the flexible display device are subjected to higher levels of strain.

The above information disclosed in this Background section is only for understanding of the background of the inventive concepts, and, therefore, it may contain information that does not constitute prior art.

SUMMARY

Exemplary embodiments of the invention provide a display device that reduces strain generated during bending or rolling.

Additional features of the inventive concepts will be set forth in the description which follows, and in part will be apparent from the description, or may be learned by practice of the inventive concepts.

An exemplary embodiment of the invention provides a display device including: a flexible substrate; a plurality of conductive lines disposed on the flexible substrate; a thin film transistor connected to the plurality of conductive lines; and an organic light emitting element connected to the thin film transistor. The conductive line has a larger width or a larger thickness, as a curvature of an area of the flexible substrate increases.

The conductive line may have a larger width or a larger thickness, as a strain that an area of the flexible substrate receives increases.

The strain may be in a range from about 0.2% to about 3%.

At least one of the width and the thickness of the conductive line may have a variation in a range from about 0.2% to about 3%.

The conductive line may include a gate line, a data line, or a common power line.

The display device may further include a touch sensor unit on the display panel. The touch sensor unit may include: a plurality of first sensing electrodes and a plurality of second sensing electrodes; and a first connection line and a second connection line connecting the first sensing electrodes and the second sensing electrodes.

The first connection line and the second connection line may have a larger width or a larger thickness, as a curvature of an area of the flexible substrate increases.

The first sensing electrode and the second sensing electrode may have a larger width, as a curvature of an area of the flexible substrate increases.

At least one of the width and the thickness of the first connection line and the second connection line may have a variation in a range from about 0.2% to about 3%.

The width of the first sensing electrode and the second sensing electrode may have a variation in a range from about 0.2% to about 3%.

Another exemplary embodiment of the invention provides a display device including a flexible display panel configured to display images; a housing in which the flexible display panel is rolled to be drawn in or out through an opening; and a stopper disposed on another side from a rolling shaft of the flexible display panel and having an area larger than an area of the opening. The flexible display panel includes: a flexible substrate; a plurality of conductive lines disposed on the flexible substrate; a thin film transistor connected to the plurality of conductive lines; and an organic light emitting element connected to the thin film transistor. The conductive line has a larger width or a larger thickness from the stopper toward the rolling shaft.

The conductive line may have a larger width or a larger thickness, as a strain that an area of the flexible substrate receives increases.

The strain may be in a range from about 0.2% to about 3%.

At least one of the width and the thickness of the conductive line may have a variation in a range from about 0.2% to about 3%.

An area of the display panel that is to be rolled when the display panel is rolled one time may have a substantially same strain, and the width and the thickness of the conductive line may be substantially uniform in the area having substantially the same strain.

The display device may further include a touch sensor unit disposed on the display panel. The touch sensor unit may include a plurality of first sensing electrodes and a plurality of second sensing electrodes; and a first connection line and a second connection line connecting the first sensing electrodes and the second sensing electrodes.

The first connection line and the second connection line may have a larger width or a larger thickness from the stopper toward the rolling shaft.

The first sensing electrode and the second sensing electrode may have a larger width from the stopper toward the rolling shaft.

At least one of the width and the thickness of the first connection line and the second connection line may have a variation in a range from about 0.2% to about 3%.

The width of the first sensing electrode and the second sensing electrode may have a variation in a range from about 0.2% to about 3%.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
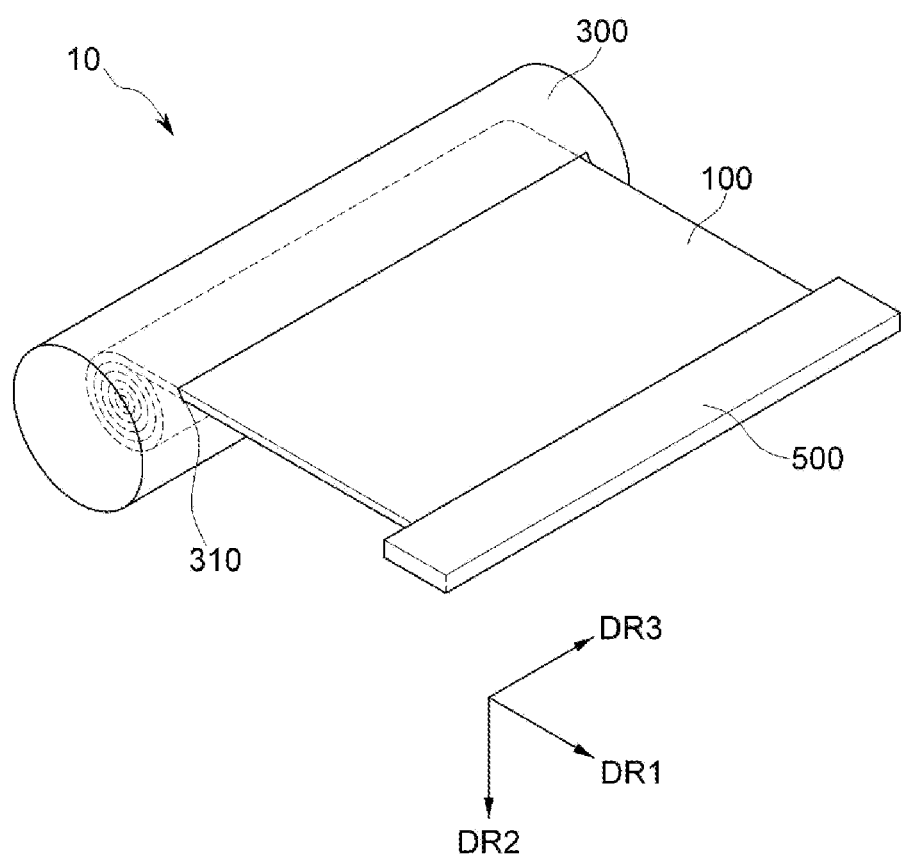
FIG. 1 is a perspective view schematically illustrating a display panel which is drawn out in a display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device according to an exemplary embodiment of the invention will be described with reference to FIGS. 1 to 9.

Figure 2:
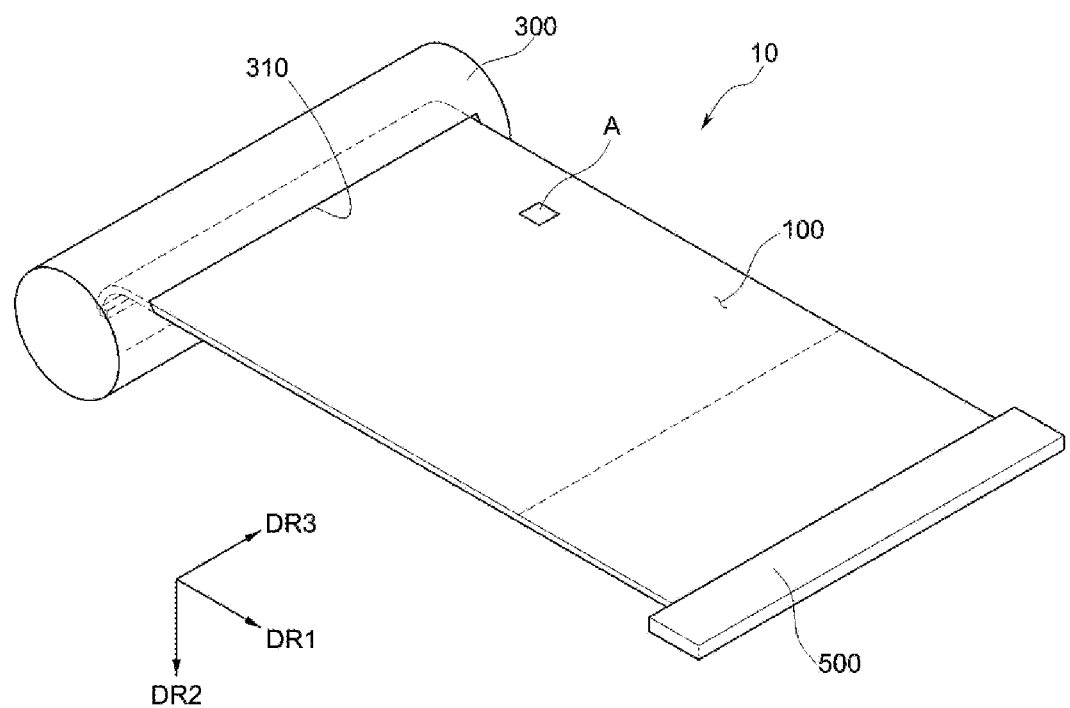
FIG. 2 is a perspective view schematically illustrating a display panel which is rolled in a display device according to an exemplary embodiment of the invention.
Figure 3:
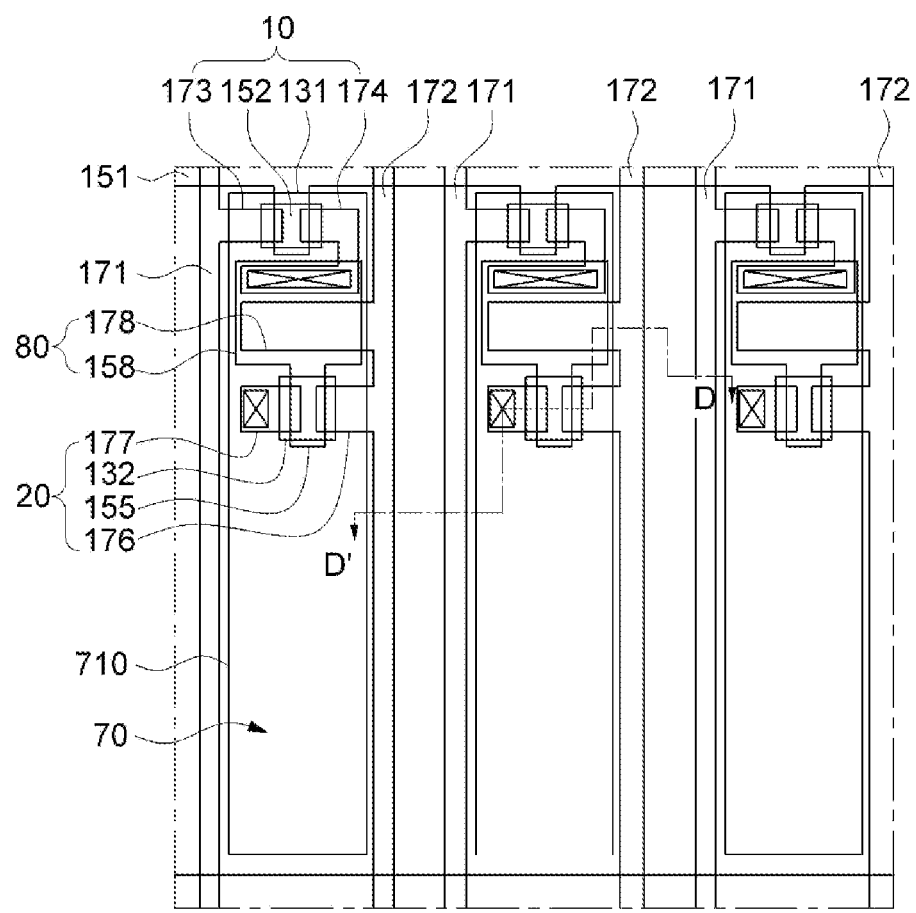
FIG. 3 is a plan view enlarging a portion "A" of FIG. 1.
Figure 4:
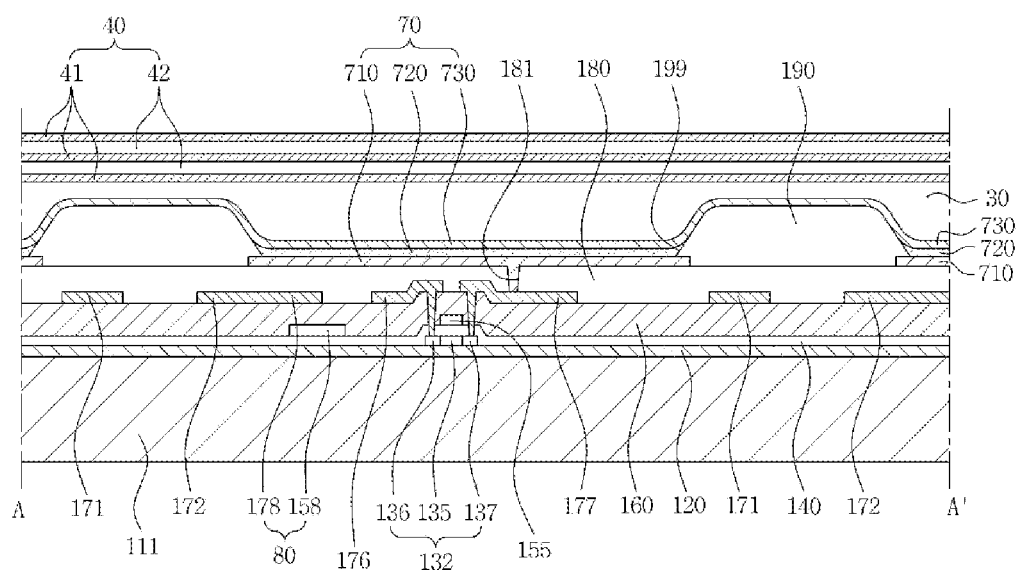
FIG. 4 is a cross-sectional view taken along line D-D' of FIG. 3.
Figure 5:
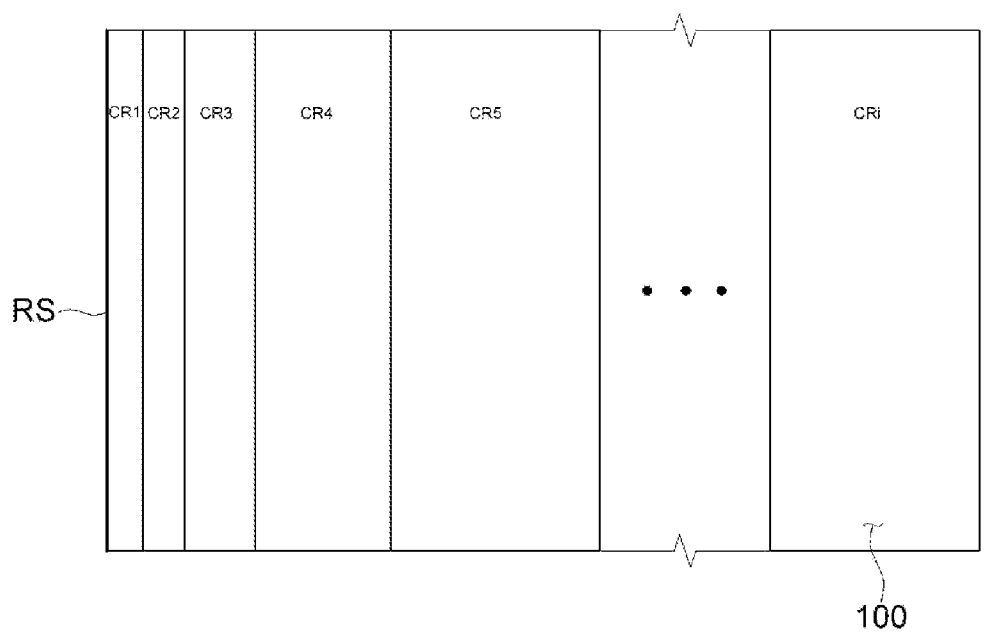
FIG. 5 is a perspective view illustrating areas of the display panel according to an exemplary embodiment of the invention, each to be rolled when the display panel is rolled one time.

FIG. 1 is a perspective view schematically illustrating a display panel which is drawn out in a display device according to an exemplary embodiment of the invention, FIG. 2 is a perspective view schematically illustrating a display panel which is rolled in a display device according to an exemplary embodiment of the invention, FIG. 3 is a plan view enlarging a portion A of FIG. 1, FIG. 4 is a cross-sectional view taken along line D-D' of FIG. 3, and FIG. 5 is a perspective view illustrating areas of the display panel according to an exemplary embodiment of the invention, each to be rolled when the display panel is rolled one time.

Referring to FIGS. 1 to 5, a display device 10 according to an exemplary embodiment of the invention includes a flexible display panel 100, a housing 300, and a stopper 500.

The flexible display panel 100 displays images processed in the display device. For example, in the case where the display device is a mobile terminal, such as a mobile phone, images, such as a user interface ("UI") or graphic user interface ("GUI") related to a call, may be displayed. The flexible display panel 100 may include flexible substrates or films which oppose each other with liquid crystals or an organic light emitting diode ("OLED") interposed therebetween.

The flexible display panel 100 may be transparent or light transmissive. The flexible display panel 100 is connected to a controller (not illustrated), and displays images by a signal transmitted from the controller.

The flexible display panel 100 has flexible characteristics. The flexible display panel 100 is drawn into and out of the inside of the housing 300. That is, the flexible display panel 100 may be rolled into the housing 300 or spread out from the housing 300.

In an exemplary embodiment, the flexible display panel 100 may be prestressed. Accordingly, if an external force is not applied to the flexible display panel 100, the flexible display panel 100 may maintain the rolled-up state. When an external force is applied to the flexible display panel 100, the flexible display panel 100 may be spread out. Further, when the external force is removed, the flexible display panel 100 may be rolled back.

The housing 300 supports one end portion of the flexible display panel 100. Further, the housing 300 allows the flexible display panel 100 to be drawn into and out of the housing 300 so that a display area of the flexible display panel 100 may be variably exposed. The housing 300 has an opening 310 through which the flexible display panel 100 is drawable.

The stopper 500 is disposed on one end portion of the flexible display panel 100 so that the flexible display panel 100 may not be completely rolled up into the housing 300. The stopper 500 is larger than the opening 310 of the housing 300.

For convenience of explanation, the case in which the flexible display panel 100 is rolled to be accommodated is defined as a "storage mode". In addition, the case where the flexible display panel 100 is spread out to display images is defined as a "development mode".

When the display device is constructed as described above, the display device may be transformed into the storage mode and the development mode, and the size thereof may be reduced.

The flexible display panel 100 includes a plurality of pixels. One pixel of the flexible display panel 100 will be described in detail with reference to FIGS. 3 and 4. The display device will be described hereinbelow with respect to an OLED display device by way of example.

FIGS. 3 and 4 illustrate an active matrix-type organic light emitting diode ("AMOLED") display device having a 2Tr- 1Cap structure. For example, the 2Tr-1Cap structure may include two TFTs, e.g., the switching TFT 10 and the driving TFT 20, and one capacitor 80 in each pixel, but the inventive concepts are not limited thereto.

For example, the OLED display device may include three or more TFTs and two or more capacitors in each pixel, and may further include additional wirings. Herein, the term "pixel" refers to a smallest unit for displaying images, and the OLED display device displays images using a plurality of pixels.

In an exemplary embodiment, each pixel may be defined by a gate line 151, a data line 171, and a common power line 172, which may serve as a boundary, but the inventive concepts are not limited thereto.

An OLED 70 includes a first electrode 710, an organic light emitting layer 720 disposed on the first electrode 710, and a second electrode 730 disposed on the organic light emitting layer 720. In an exemplary embodiment, at least one first electrode 710 is formed in each pixel, and thus, the first substrate 111 includes a plurality of first electrodes 710 spaced apart from each other.

In such an exemplary embodiment, the first electrode 710 is an anode, which is a hole injection electrode, and the second electrode 730 is a cathode, which is an electron injection electrode. However, the inventive concepts are not limited thereto, and the first electrode 710 may be a cathode and the second electrode 730 may be an anode according to a driving scheme of the OLED display device. In addition, the first electrode 710 is a pixel electrode, and the second electrode 730 is a common electrode.

Holes and electrons injected into the organic light emitting layer 720 are combined to generate an exciton, and a light is emitted when the exciton falls from the excited state to the ground state.

The capacitor 80 includes a pair of storage electrodes 158 and 178 with an insulating layer 160 interposed therebetween. In such an exemplary embodiment, the insulating layer 160 may be a dielectric element. A capacitance of the capacitor 80 is determined by electric charges accumulated in the capacitor 80 and a voltage across the pair of storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may serve as a switching element which selects a pixel to perform light emission. The switching gate electrode 152 is connected to the gate line 151, and the switching source electrode 173 is connected to the data line 171. Spaced apart from the switching source electrode 173, the switching drain electrode 174 is connected to a first storage electrode 158.

The driving TFT 20 applies, to the first electrode 710, a driving power which allows the organic light emitting layer 720 of the OLED 70 in the selected pixel to emit light. The driving gate electrode 155 is connected to the first storage electrode 158 that is connected to the switching drain electrode 174. Each of the driving source electrode 176 and a second storage electrode 178 is connected to the common power line 172.

The driving drain electrode 177 is connected to the first electrode 710 of the OLED 70 through a drain contact hole 181.

With the above described structure, the switching TFT 10 is driven based on a gate voltage applied to the gate line 151 and serves to transmit a data voltage applied to the data line 171 to the driving TFT 20.

A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 70 through the driving TFT 20 such that the OLED 70 may emit light.

The OLED 70, the driving TFT 20, the capacitor 80, the data line 171, and the common power line 172, which are illustrated in FIG. 4, will be mainly described. The switching semiconductor layer 131, the switching gate electrode 152, the switching source and the drain electrodes 173 and 174 of the switching TFT 10 have substantially the same stack structure as those of the driving semiconductor layer 132, the driving gate electrode 155, and the driving source and drain electrodes 176 and 177 of the driving TFT 20, respectively, and the description thereof will be omitted.

Referring to FIG. 4, the first substrate 111 may include a flexible material. An example of the flexible material may include a plastic material. For example, the first substrate 111 may include one selected from the group consisting of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and/or the like. Among them, polyimide (PI) is excellent in heat resistance and is suitable as a material of the first substrate 111 which should undergo a high temperature process.

In addition, the first substrate 111 has a thickness in a range from about 5 μm to about 200 μm. When the first substrate 111 has a thickness less than about 5 μm, it is difficult for the first substrate 111 to stably support an organic light emitting element. On the other hand, when the first substrate 111 has a thickness of about 200 μm or more, the flexible characteristics of the first substrate 111 may be degraded.

A buffer layer 120 is disposed on the first substrate 111. The buffer layer 120 serves to substantially prevent permeation of undesirable elements and to planarize a surface therebelow, and may include suitable materials for planarizing and/or preventing permeation. For example, the buffer layer 120 may include at least one of: silicon nitride ($SiN_x$), silicon oxide ($SiO_2$), and silicon oxynitride ($SiO_xN_y$).

The driving semiconductor layer 132 is disposed on the buffer layer 120. The driving semiconductor layer 132 may include at least one of: polycrystalline silicon, amorphous silicon and oxide semiconductor. In addition, the driving semiconductor layer 132 includes a channel area 135 which is not doped with impurities, and further includes a source area 136 and a drain area 137 which are $p^+$-doped and formed on the opposite sides of the channel area 135. In such an embodiment, p-type impurities, such as boron B, may be used as dopant ions and $B_2H_6$ is typically used. Such impurities may vary depending on the kinds of TFTs.

A gate insulating layer 140 is disposed on the driving semiconductor layer 132. The driving gate electrode 155, the gate line 151 (see FIG. 9), and the first storage electrode 158 are formed on the gate insulating layer 140. In such an embodiment, the driving gate electrode 155 overlaps at least a portion of the driving semiconductor layer 132, for example, the channel area 135. The driving gate electrode 155 serve to substantially prevent impurities from being doped into the channel area 135 when the impurity is doped into the source area 136 and the drain area 137 of the driving semiconductor layer 132 while forming the driving semiconductor layer 132.

The gate electrode 155 and the first storage electrode 158 are disposed on a substantially same layer and include a substantially same metal material. In such an embodiment, examples of the metal material may include at least one of molybdenum (Mo), chromium (Cr), and tungsten (W).

The insulating layer 160 is disposed on the gate insulating layer 140 to cover the gate electrode 155. The insulating layer 160 may be an insulting interlayer. The insulating layer 160, similar to the gate insulating layer 140, may include silicon nitride (SiNx), silicon oxide (SiOx), or the like.

The driving source electrode 176, the driving drain electrode 177, the data line 171, the common power line 172, and the second storage electrode 178 are formed on the insulating layer 160 in a display area DA. The driving source electrode 176 and the driving drain electrode 177 are connected to the source area and the drain area of the driving semiconductor layer 132 through contact holes, respectively.

A protective layer 180 covering the driving source electrode 176, the driving drain electrode 177, and the like is formed on the insulating layer 160. The protective layer 180 may include an organic material based on, for example, polyacryl, polyimide, or the like.

The protective layer 180 has the drain contact hole 181 for exposing the driving drain electrode 177.

The first electrode 710 is formed on the protective layer 180, and the first electrode 710 is connected to the driving drain electrode 177 through the drain contact hole 181 of the protective layer 180.

A pixel defining layer 190 covering the first electrode 710 is formed on the protective layer 180. The pixel defining layer 190 has an opening 199 for exposing the first electrode 710.

That is, the first electrode 710 is disposed to correspond to the opening 199 of the pixel defining layer 190. The organic emission layer 720 is formed on the first electrode 710 in the opening 199 of the pixel defining layer 190, and the second electrode 730 is formed on the pixel defining layer 190 and the organic emission layer 720.

Accordingly, the OLED 70 including the first electrode 710, the organic light emitting layer 720, and the second electrode 730 is formed.

One of the first electrode 710 and the second electrode 730 may include a transparent conductive material and the other may include a transflective or reflective conductive material. The OLED display device 10 may be a top emission type, a bottom emission type, or a double-sided emission type depending on the kind of the material forming the first electrode 710 and the second electrode 730.

A capping layer 30 may be disposed on the second electrode 730 in order to substantially protect the OLED 70 before the formation of a thin film encapsulation layer 40, and to prevent the OLED 70 from being damaged in the process of forming the thin film encapsulation layer 40. However, the capping layer 30 may be omitted, and an organic layer 42 of the thin film encapsulating layer 40 may be disposed in place of the capping layer 30.

The capping layer 30 may include a single layer or may include two or more layers. The capping layer 30 may have moisture or oxygen barrier properties.

The thin film encapsulation layer 40 is formed on the capping layer 30. The thin film encapsulation layer 40 is formed directly on the OLED 70 to seal a driving circuit unit and the OLED.

The thin film encapsulation layer 40 includes two or more inorganic layers 41 and two or more organic layers 42 which are alternately stacked one by one. It is illustrated in FIG. that three inorganic layers 41 and two organic layers 42 are alternately stacked one by one to form the thin film encapsulation layer 40. However, the number of the inorganic layers 41 and the organic layers 42 is not limited to the above example.

The inorganic layer 41 serves to suppress penetration of moisture and oxygen toward the flexible display panel, and the organic layer 42 serves to mitigate the internal stress of the inorganic layer 41 and fill the micro cracks and pinholes of the inorganic layer 41.

As described above with reference to FIGS. 3 and 4, the flexible display panel 100 includes conductive lines including the gate line 151, the data line 171, and the common power line 172.

FIG. 5 is a perspective view illustrating areas of the display panel according to an exemplary embodiment of the invention, each to be rolled when the display panel is rolled one time.

As illustrated in FIG. 5, the display panel 100 is divided into unit areas CR1, CR2, . . . , CRi of one cycle to be rolled about a virtual rolling shaft RS making a full turn.

Widths of the unit areas CR1, CR2, . . . , CRi of one cycle increase as they are further away from the rolling shaft RS. A radius of curvature of the display panel 100 increases as the distance from the rolling shaft RS increases, and decreases as the distance from the rolling shaft RS decreases.

Figure 6:
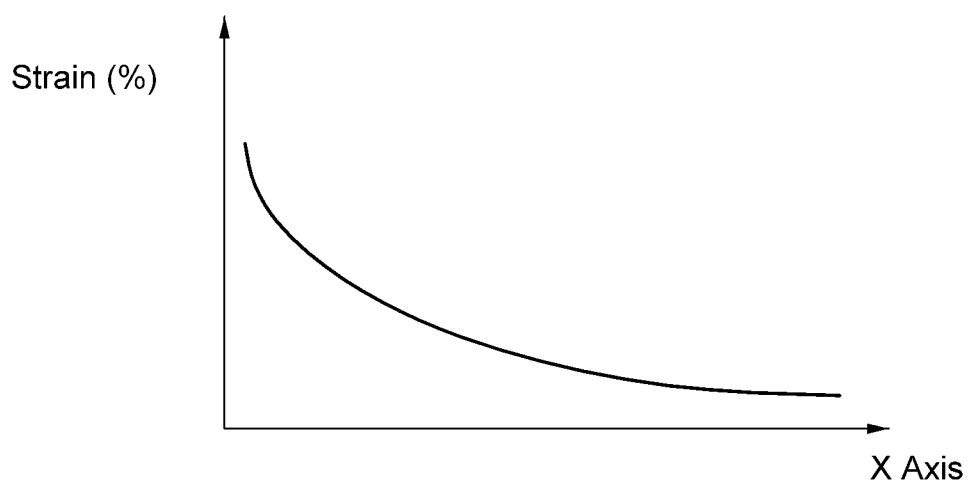
FIG. 6 is a graph illustrating a strain in a storage mode of the display device according to an exemplary embodiment of the invention.
Figure 7:
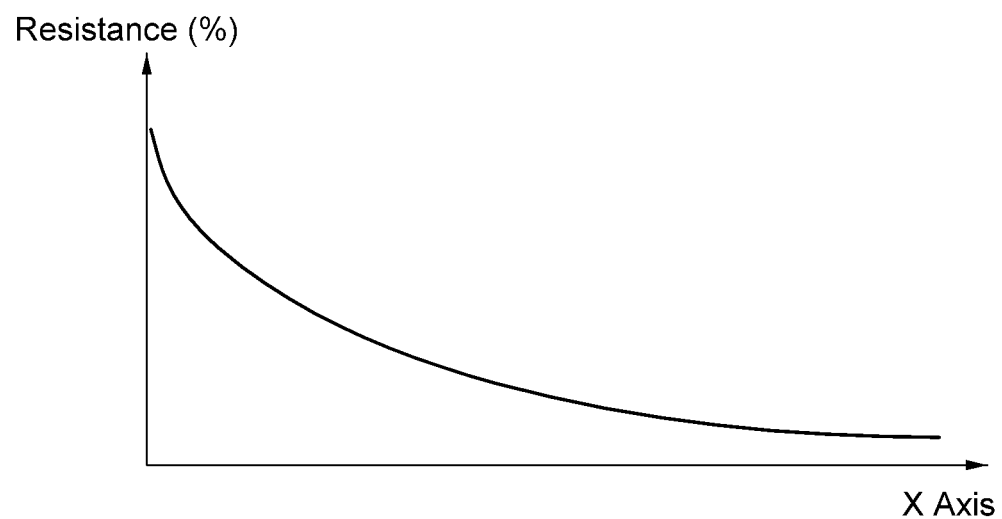
FIG. 7 is a graph illustrating a resistance value of the display device according to an exemplary embodiment of the invention.

FIG. 6 is a graph illustrating the relationship between a strain and a planar distance of the flexible display panel measured from the rolling shaft to the stopper when the display device according to an exemplary embodiment of the invention is in a storage mode, and FIG. 7 is a graph illustrating a resistance value of the conductive line of the display device according to an exemplary embodiment of the invention.

Referring to FIGS. 6 and 7, when the display device is in the storage mode, it may be appreciated that the display panel is subjected to a greater strain and a greater resistance when closer to the rolling shaft of the display device. In addition, as the resistance of the conductive line increases, a voltage applied to the display panel falls more largely as a result of an IR drop.

Accordingly, it is necessary to design a line width or a thickness of the conductive line in consideration of the change value in resistance as the strain occurs.

The line width of the conductive line is adjustable using a mask pattern, and the thickness of the conductive line is adjustable using a halftone mask.

The strain distribution varies depending on the stack structure, thickness, and radius of curvature of the display panel, and the type of the conductive line. For example, the display panel adjacent to the rolling shaft receives a strain in a range from about 1% to about 3% per unit area of one cycle, and an outermost portion of the display panel adjacent to the stopper receives a strain in a range from about 0.2% to about 0.5% per unit area of one cycle. Accordingly, the conductive line receives a strain in a range from about 0.2% to about 3% depending on the position on the display panel.

An amount of change in resistance of metal depending on the strain may be calculated through Equations 1 and 2:

$$\text{Strain}(\varepsilon) = \frac{\Delta R}{GF \cdot R_0}, \Delta R = R_1(\text{after}) - R_0(\text{initial}) \quad [\text{Equation 1}]$$

$$GF(\text{gauge factor}) = (\varepsilon) = \frac{\Delta R / R_0}{\varepsilon} = \frac{\Delta \rho / \rho_0}{\varepsilon} + 1 + 2\upsilon \quad [\text{Equation 2}]$$

where $\upsilon$ is the Poisson's ratio, and a value of GF is about 2 to about 5 in general.

Referring to Equation 1, it may be appreciated that the strain applied to the conductive line of the display panel is proportional to the rate of change of the resistance R.

Equation 2 is a formula for obtaining a gauge rate representing the relationship between strain and resistance.

Referring to Equation 2, the gage ratio GF is a rate of change in resistance per unit strain, $\upsilon$ refers to the Poisson's ratio, "$1+2\upsilon$" represents the influence of geometric deformation of a resistor, and $$\frac{\Delta \rho / \rho_0}{\varepsilon}$$

represents the influence of changes in physical properties of a resistive material. In general, GF of a metal is in a range from about 2 to about 5.

The rate of change in the resistance of the conductive line depending on the strain may be calculated through Equations 1 and 2. In addition, ΔR may be calculated based on the obtained value, and at least one of the line width or the thickness of the conductive line may be adjusted accordingly.

Table 1 shows values of the circularity and final radii of curvature in accordance with an increase in the cycle when a 14-inch display panel, having a thickness of about 500 μm, is in the storage mode, and Table 2 shows a strain variation of a conductive line in accordance with an increase in the cycle when a 14-inch display panel, having a thickness of about 500 μm, is in the storage mode.

Table 2 shows the strain variation of a metal line in accordance with an increase in the cycle in the display panel of Table 1. In such an embodiment, a distance d of the metal line from a neutral plane of the panel is about 10 μm.

TABLE 1

| Stack thickness | Thickness 500 | | |
|---|---|---|---|
| Curvature | Display panel 1 | Display panel 2 | Display panel 3 |
| Cycle 1 | 7.85 | 20.41 | 32.97 |
| Cycle 2 | 10.99 | 23.55 | 36.11 |
| Cycle 3 | 14.13 | 26.69 | 39.25 |
| Cycle 4 | 17.27 | 29.83 | 42.39 |
| Cycle 5 | 20.41 | 32.97 | 45.53 |
| Cycle 6 | 23.55 | 36.11 | 48.67 |
| Cycle 7 | 26.69 | 39.25 | 51.81 |
| Cycle 8 | 29.83 | 42.39 | 54.95 |
| Cycle 9 | 32.97 | 45.53 | |
| Cycle 10 | 36.11 | 48.67 | |
| Cycle 11 | 39.25 | | |
| Cycle 12 | 42.39 | | |
| Cycle 13 | 45.53 | | |
| Total length | 346.97 | 345.4 | 351.68 |
| Final R | 7.5 | 8 | 9 |

Referring to Table 1, the final radii of curvature of the display panel 1, the display panel 2, and the display panel 3 are 7.5 mm (R1), 8 mm (R2), and 9 mm (R3), respectively. The numbers of times of rolling the display panel 1, the display panel 2, and the display panel 3 are 13 cycles, 10 cycles, and 8 cycles, respectively. Lengths of the unit area of Cycle 1 of the display panel 1, the display panel 2, and the display panel 3 are 7.85 mm, 20.41 mm, and 32.97 mm, respectively.

It may be appreciated from the result that a slight change in the final radius of curvature of the display panel may result in a large change in the length of the unit area of Cycle 1.

TABLE 2

| Stack thickness | Thickness 500 | | |
|---|---|---|---|
| Curvature | Display panel 1 | Display panel 2 | Display panel 3 |
| Cycle 1 | 1.00% | 0.33% | 0.20% |
| Cycle 2 | 0.67% | 0.29% | 0.18% |
| Cycle 3 | 0.50% | 0.25% | 0.17% |
| Cycle 4 | 0.40% | 0.22% | 0.15% |
| Cycle 5 | 0.33% | 0.20% | 0.14% |
| Cycle 6 | 0.29% | 0.18% | 0.13% |
| Cycle 7 | 0.25% | 0.17% | 0.13% |
| Cycle 8 | 0.22% | 0.15% | 0.11% |
| Cycle 9 | 0.20% | 0.14% | |
| Cycle 10 | 0.18% | 0.13% | |
| Cycle 11 | 0.17% | | |
| Cycle 12 | 0.15% | | |
| Cycle 13 | 0.14% | | |

Referring to Table 2, the strain of the conductive line of the display panel 1 at Cycle 13 is about 0.14%, the strain of the conductive line of the display panel 1 at Cycle 12 is about 0.15%, the strain of the conductive line of the display panel 1 at Cycle 11 is about 0.17%, and the strain of the conductive line of the display panel 1 at Cycle 1 is about 1.00%, Accordingly, it may be appreciated that the strain of the conductive line increases, as the cycle decreases, that is, as closer to the rolling shaft.

In addition, it may be appreciated that a slight decrease in the final radius of curvature of the display panel may result in a large change in the strain of Cycle 1.

The strain of the conductive line in each cycle becomes $$\varepsilon = \frac{d}{R + (n-1)t},$$

where d is a distance from the display panel to the conductive line, R is a radius of curvature of the first cycle, n is the number of rolling events (number of cycles), and t is the thickness of the display panel.

As may be appreciated from this formula and Table 2, the strain of the conductive line decreases as the initial radius of curvature increases, and decreases as the thickness of the display panel increases.

Figure 8:
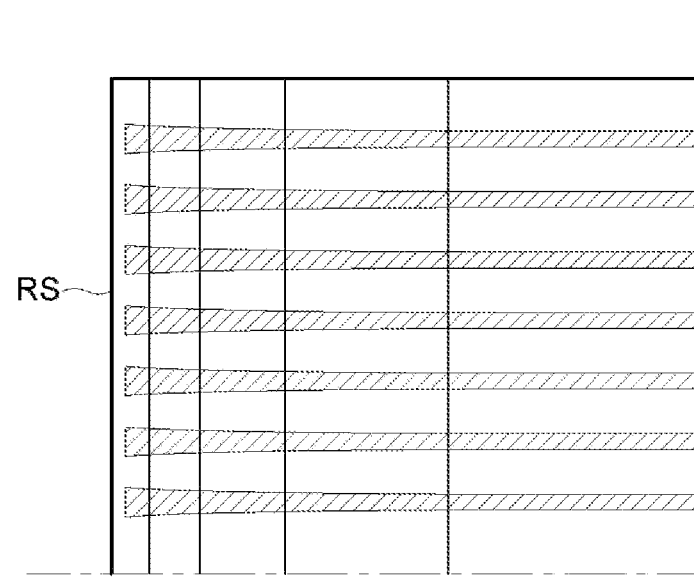
FIG. 8 is a plan view illustrating a conductive line according to an exemplary embodiment of the invention.

FIG. 8 is a plan view illustrating a conductive line according to an exemplary embodiment of the invention.

As described above with reference to FIGS. 1 to 7, the conductive line CL0 of the flexible display panel has a larger width or a larger thickness from the stopper toward the rolling shaft.

At least one of the width and the thickness of a conductive line CL0 has a variation in a range from about 0.2% to about 3%.

FIG. 8 shows that when the strain decreases as the distance from the rolling shaft RS increases, the width of the conductive line CL0 gradually decreases as the distance from the rolling shaft RS increases.

Figure 9:
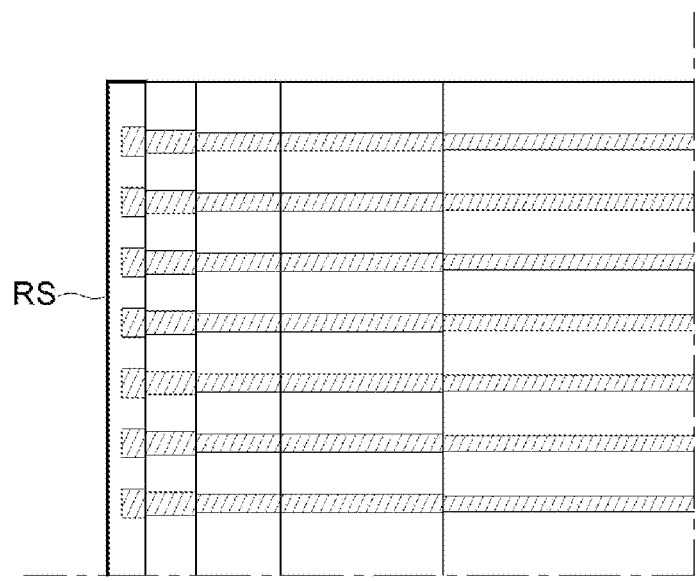
FIG. 9 is a plan view illustrating a conductive line according to another exemplary embodiment of the invention.

FIG. 9 is a plan view illustrating a conductive line according to another embodiment of the invention.

FIG. 9 shows that when the strain decreases from the rolling shaft RS toward another end, the width of the conductive line CL0 gradually decreases from the rolling shaft RS toward another end.

Since the strain is substantially the same in the unit area of one cycle, the width and the thickness of the conductive line CL0 are substantially uniform in the unit area of one cycle.

Figure 10:
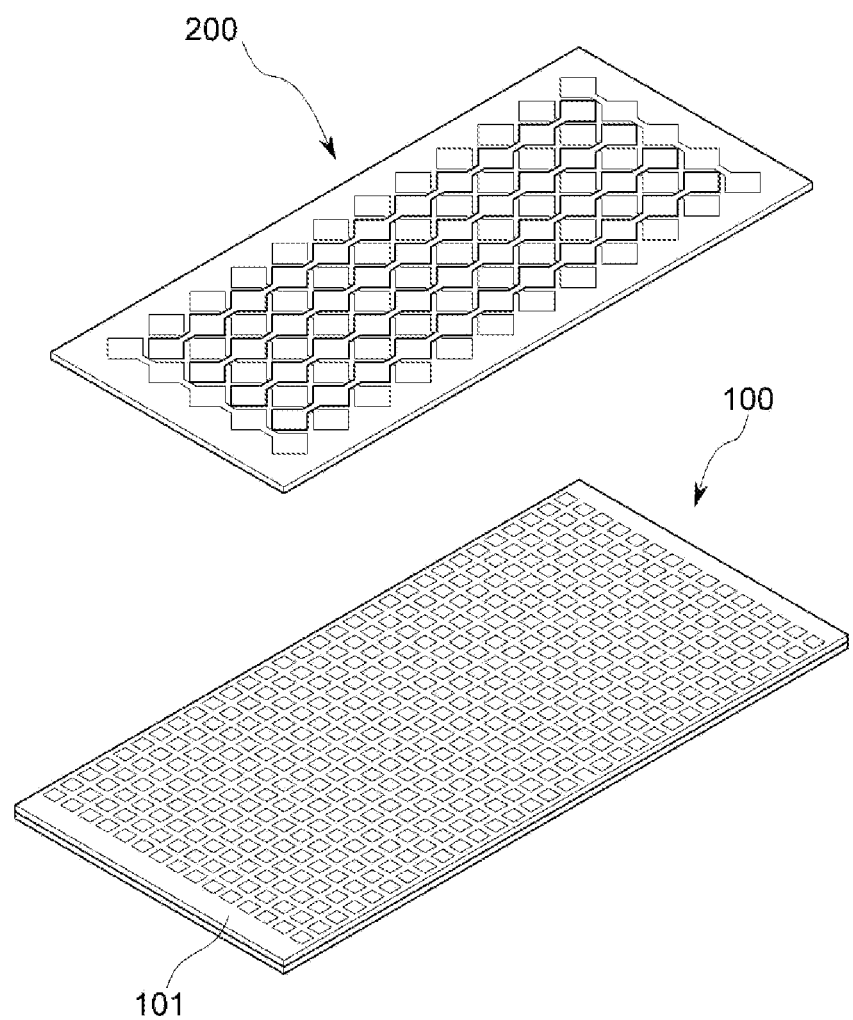
FIG. 10 is an exploded perspective view illustrating a display device including a touch sensor according to an exemplary embodiment of the invention.
Figure 11:
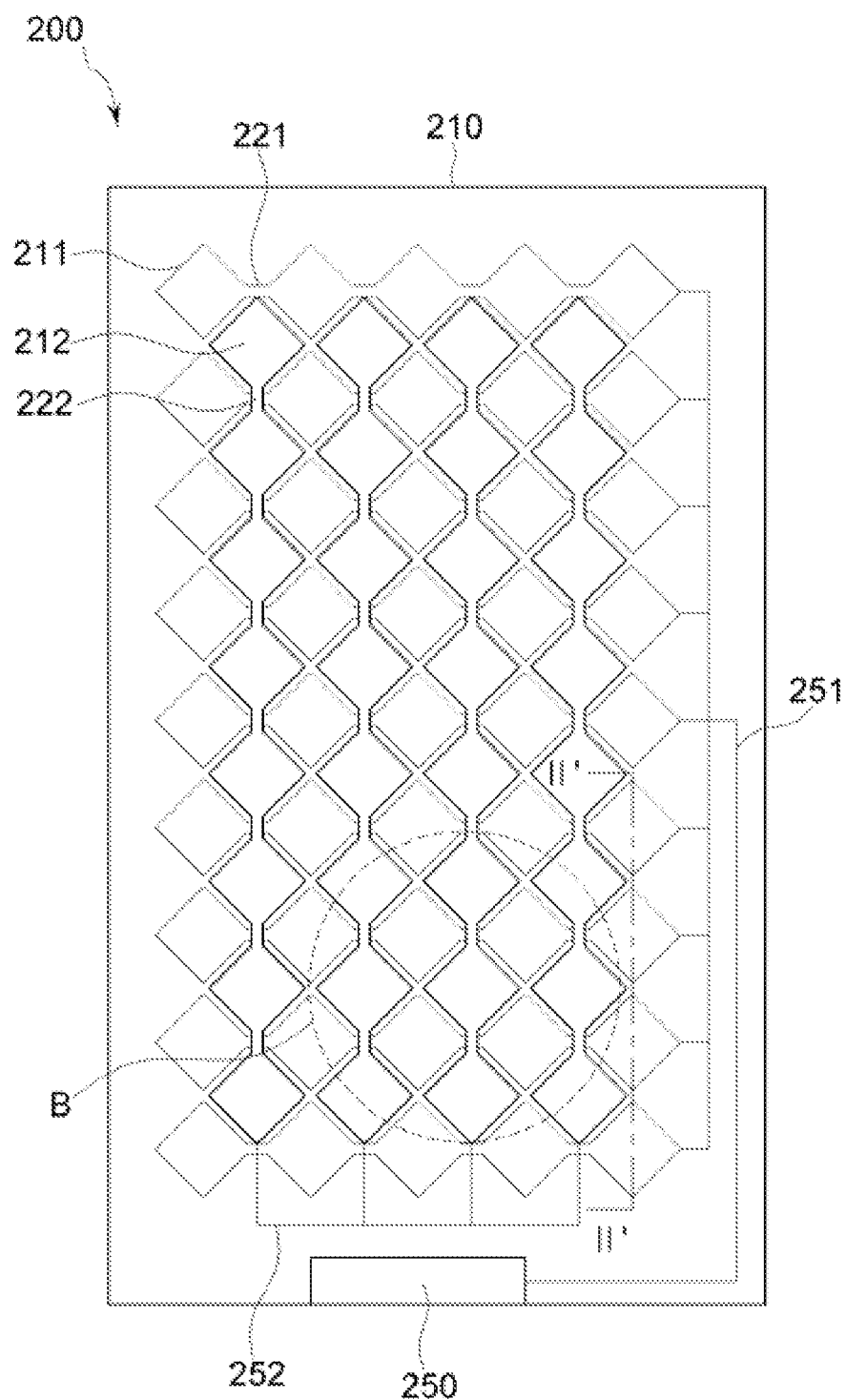
FIG. 11 is a plan view illustrating a touch sensor according to an exemplary embodiment of the invention.
Figure 12:
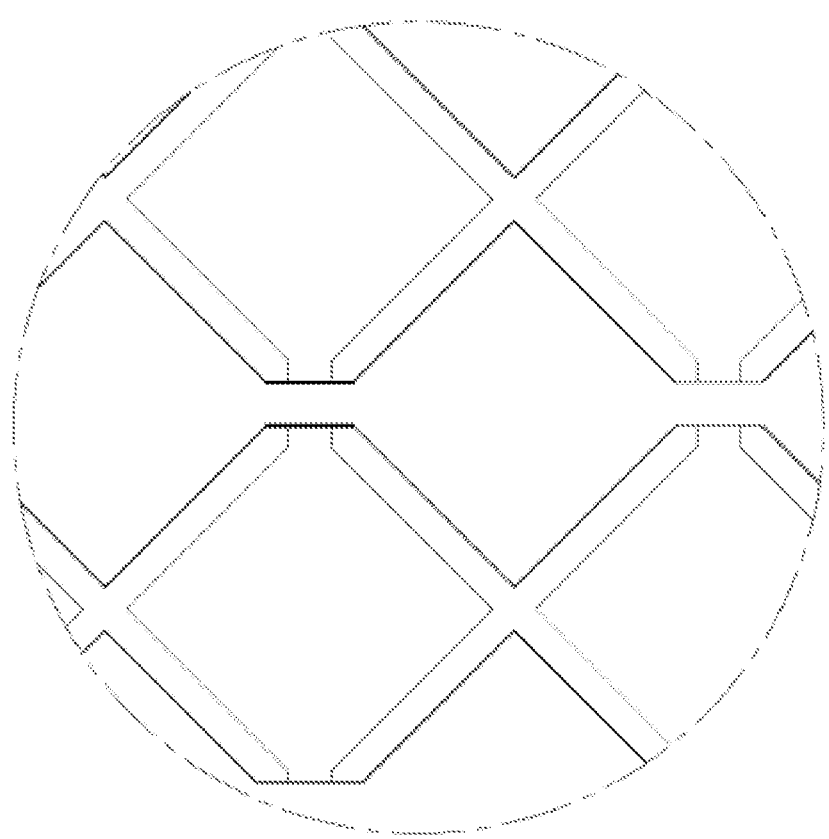
FIG. 12 is a enlarged view of a portion "B" of FIG. 11.
Figure 13:
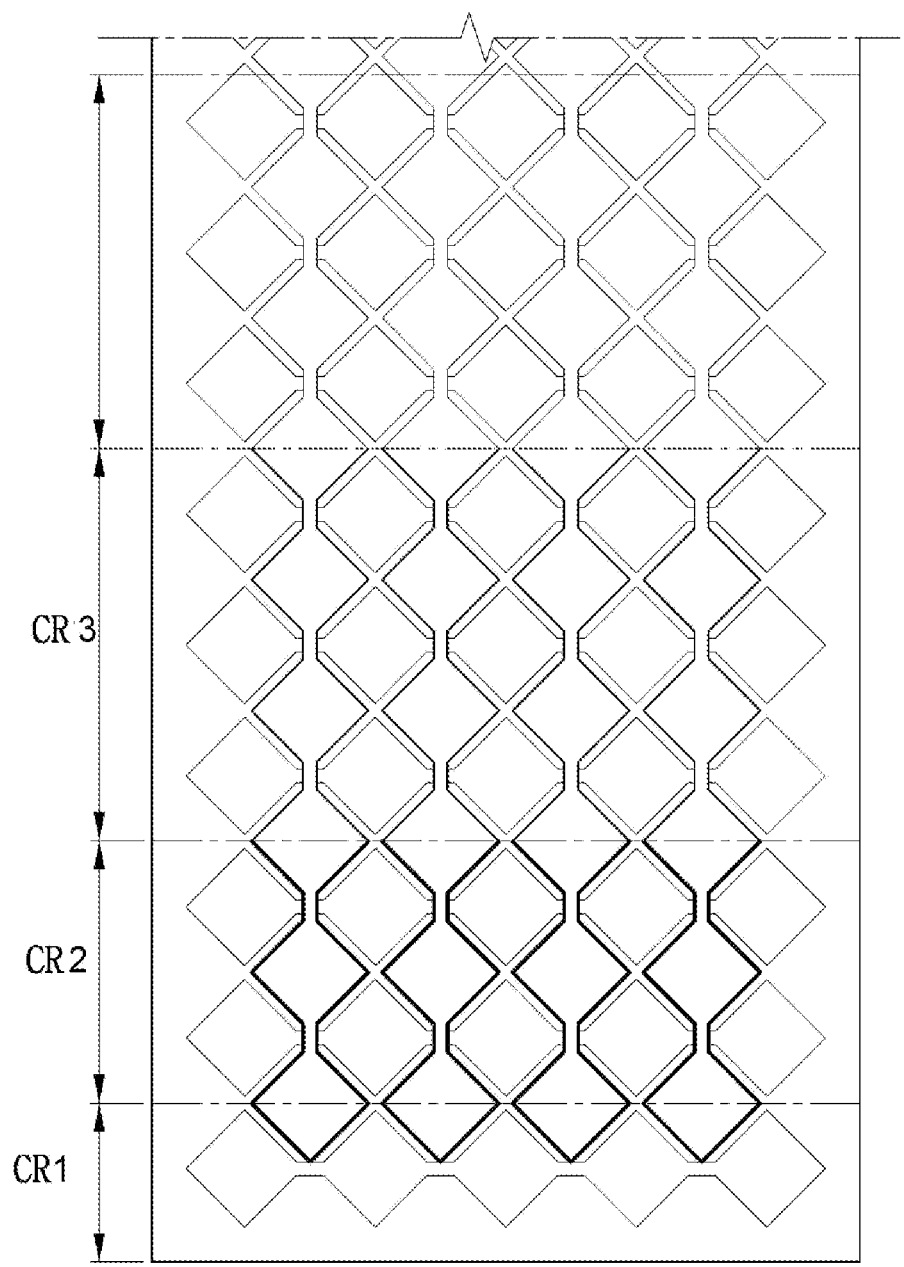
FIG. 13 is a plan view illustrating a touch sensor according to an exemplary embodiment of the invention.

FIG. 10 is an exploded perspective view illustrating a display device including a touch sensor according to an exemplary embodiment of the invention, FIG. 11 is a plan view illustrating a touch sensor according to an exemplary embodiment of the invention, FIG. 12 is a view enlarging a portion B of FIG. 11, and FIG. 13 is a plan view illustrating a touch sensor according to an exemplary embodiment of the invention.

Referring to FIG. 10, a display device according to another exemplary embodiment of the invention may further include a touch sensor unit 200 on the display panel 100 of FIG. 5.

The display panel 100 is substantially the same as that described in FIGS. 1 to 5, and the description thereof will be omitted.

The touch sensor unit 200 may have a substantially same shape as a shape of the display panel 100.

The touch sensor unit 200 according to an exemplary embodiment of the invention includes a touch substrate 210, a plurality of first sensing electrodes 211 and a plurality of second sensing electrodes 212 on the touch substrate 210, a first connection line 221 for connecting the first sensing electrodes 211, a second connection line 222 for connecting the second sensing electrodes 212, a touch driver 250, and the like. The first sensing electrodes 211 may be connected to the touch driver 250 through a first routing wiring 251, and the second sensing electrodes 212 may be connected to the touch driver 250 through a second routing wiring 252.

It is illustrated that in the touch sensor unit 200 according to an embodiment of the invention, the plurality of first sensing electrodes 211 and the plurality of second sensing electrodes 212 are formed on the touch substrate 210 to be disposed on the display panel 100, but the inventive concepts are not limited thereto. Alternatively, the touch substrate 210 may be omitted, and the plurality of first sensing electrodes 211 and the plurality of second sensing electrodes 212 may be directly formed on the display panel 100.

The first sensing electrode 211 and the second sensing electrode 212 may be arranged so as not to overlap each other on a plane. Although the first sensing electrode 211 and the second sensing electrode 212 are illustrated as rhombic surface electrodes, the inventive concepts are not limited thereto. Alternatively, the first sensing electrode 211 and the second sensing electrode 212 may have a triangular or quadrangular shape, or a mesh electrode shape.

The first sensing electrode 211 and the second sensing electrode 212 may be appropriately sized to detect a touch according to the size and purpose of the display panel 100. For example, an area of the first sensing electrode 211 and the second sensing electrode 212 may be in a range of several to several tens of square millimeters ($mm^2$).

The first sensing electrode 211 and the second sensing electrode 212 may be formed on a substantially same layer, or may be formed insulated from each other by an insulating layer or the like. The first connection line 221 and the second connection line 222 may be insulated from and cross each other on a plane.

The first sensing electrode 211, the second sensing electrode 212, the first connection line 221, and the second connection line 222 may include a metal or a transparent conductive oxide (TCO). Such a transparent conductive oxide (TCO) may include at least one of: indium tin oxide (ITO), indium zinc oxide (IZO), zinc oxide (ZnO), carbon nanotube (CNT), and graphene.

The touch driver 250 may input a driving signal to the first sensing electrode 211, and may detect a touch input and determine touch coordinates based on a capacitance variation or a voltage variation measured by the second sensing electrode 212, for example.

Referring to FIGS. 11 and 12, the touch sensor unit 200 includes the plurality of first sensing electrodes 211 and the plurality of second sensing electrodes 212.

When the display panel including the touch sensor unit 200 is rolled around the rolling shaft RS, the touch sensor unit 200 also receives different strains according to each unit area of the touch sensor unit 200 as described above.

That is, since the first sensing electrode 211 and the second sensing electrode 212 receive a greater strain during rolling, as they get closer to the rolling shaft RS, the touch sensor unit 200 relatively close to the rolling shaft RS may be formed thicker.

The strain to which the touch sensor unit 200 is subjected is in a range from about 0.2% to about 3%.

In addition, since the first connection line 221 and the second connection line 222 also receive a greater strain during rolling as they get closer to the rolling shaft RS, at least one of a width or a thickness of the first connection line 221 and the second connection line 222 relatively close to the rolling shaft RS may be formed thicker.

As illustrated in FIG. 13, the first sensing electrode 211 and the second sensing electrode 212 of the touch sensor unit may have substantially the same thickness in an area that is to be rolled when the display panel is rolled once.

Figure 14:
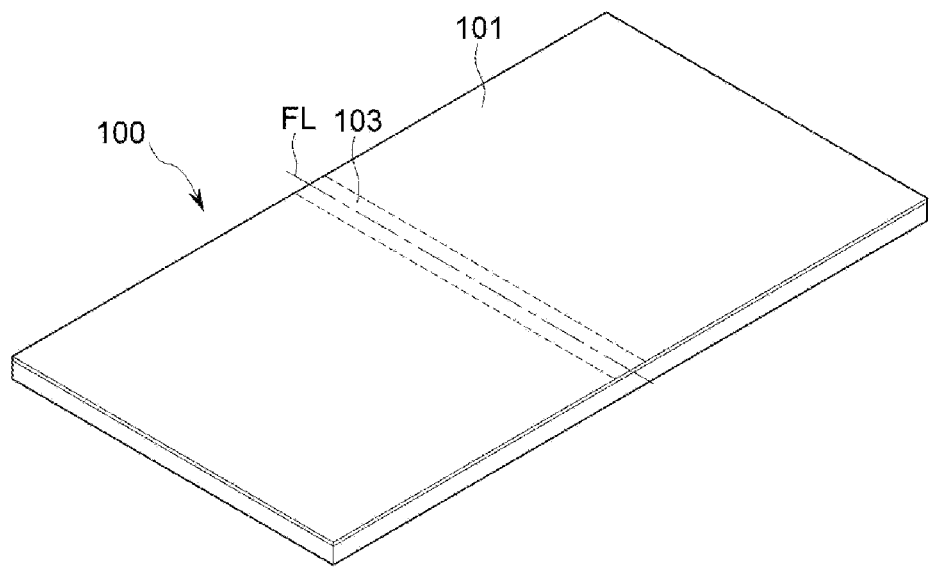
FIG. 14 is a perspective view schematically illustrating a display panel according to another exemplary embodiment of the invention.
Figure 15:
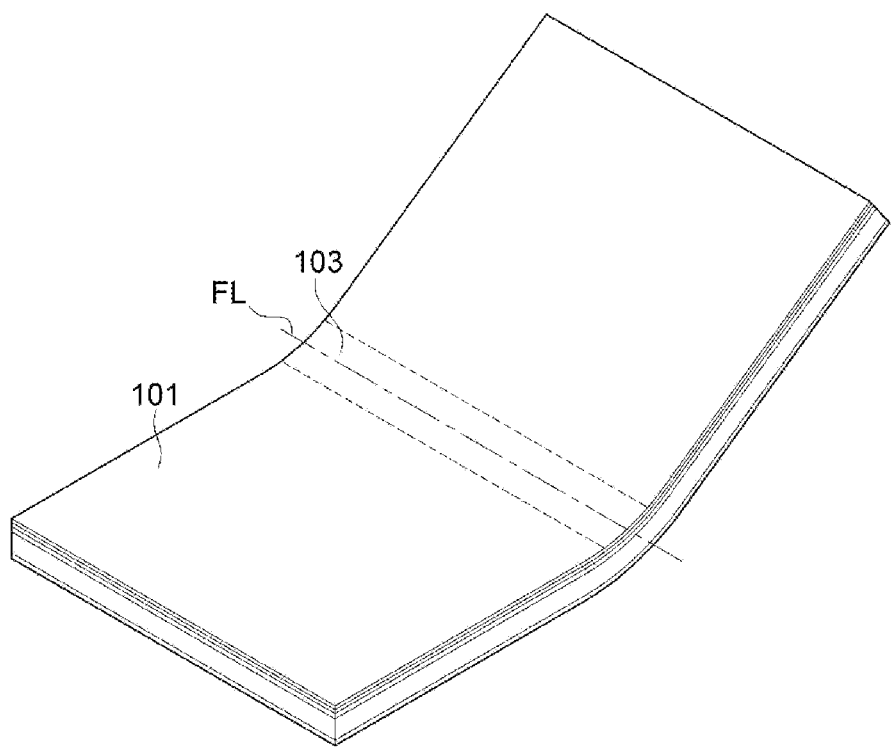
FIG. 15 is a perspective view illustrating a display device according to another exemplary embodiment of the invention in a folded state.
Figure 16:
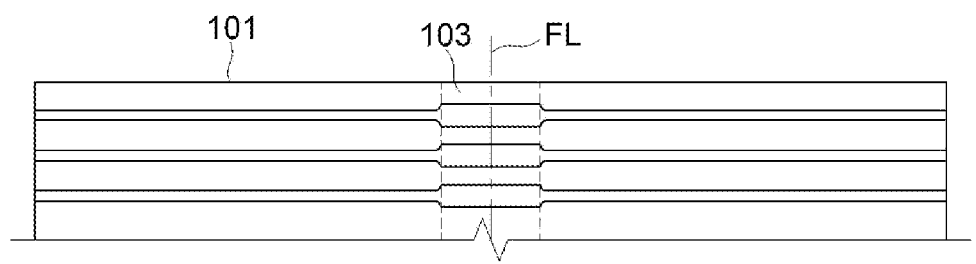
FIG. 16 is a plan view illustrating a conductive line of a display device according to another exemplary embodiment of the invention.

FIG. 14 is a perspective view schematically illustrating a display panel according to another exemplary embodiment of the invention, FIG. 15 is a perspective view illustrating a display device according to another exemplary embodiment of the invention in a folded state, and FIG. 16 is a plan view illustrating a conductive line of a display device according to another exemplary embodiment of the invention.

Referring to FIGS. 14 to 16, a display panel 100 according to another exemplary embodiment of the invention includes a bending area 103 that may be bent with respect to a folding line FL and planar areas 101 on the opposite sides of the bending area 103.

In the drawings, the display panel 100 is illustrated to be curved bilaterally symmetrically with respect to the folding line FL, but the inventive concepts are not limited thereto. Alternatively, the display panel 100 may be curved bilaterally asymmetrically.

Although the bending area 103 and the planar area 101 of the display panel 100 are described as divided areas for convenience of explanation, they may be actually a single display area. A plurality of pixels may be disposed in each of the bending area 103 and the planar area 101 of the display panel 100 to display images.

In addition, the display panel 100 according to an exemplary embodiment of the invention is described on the assumption that the display panel 100 is bent inwardly with respect to an area where images are displayed, but embodiments are not limited thereto. The display panel 100 may be curved outwardly with respect to the area where images are displayed.

The display panel 100 may include, for example, a flexible film such as a plastic film, and may be implemented by disposing an OLED and a pixel circuit on a flexible film. Other components except for the conductive line 150 of the display panel 100 are substantially the same as the components illustrated in FIGS. 2 and 3, and the detailed description thereof will be omitted.

The bending area 103 receives a greater strain than a strain which the planar area 101 receives, when the flexible substrate 100 is bent. The strain is in a range from about 0.2% to about 3%.

Referring to FIG. 16, a conductive line CL0 has a larger width or a larger thickness, as the area of the flexible substrate 100 has a larger curvature. The conductive line CL0 has a larger width or a larger thickness, as the area of the flexible substrate 100 receives a greater strain.

At least one of the width and the thickness of a conductive line CL0 has a variation in a range from about 0.2% to about 3%.

The conductive line CL0 may be a gate line 151, a data line 171, or a common power line 172.

A touch sensor unit for sensing a user's touch operation may be disposed on the flexible substrate 100. The touch sensor unit may be implemented on a separate substrate to be disposed on the display panel 100 or directly inside the display panel 100.

As illustrated in FIG. 11, the touch sensor unit may include a touch substrate 210, a plurality of first sensing electrodes 211 and a plurality of second sensing electrodes 212 on the touch substrate 210, a first connection line 221 for connecting the first sensing electrodes 211, a second connection line 222 for connecting the second sensing electrodes 212, a touch driver 250, and the like.

Unlike what is shown in FIG. 11, the plurality of first sensing electrodes 211, the plurality of second sensing electrodes 212, the first connection line 221, and the second connection line 222 have a larger width or a larger thickness, as the area of the bending area 103 in the flexible substrate 100 has a larger curvature.

At least one of the width and the thickness of the first connection line 221 and the second connection line 222 has a variation in a range from about 0.2% to about 3%.

As set forth hereinabove, according to one or more exemplary embodiments, the display panel and the display device include a conductive line that substantially prevents a voltage drop therein in consideration of strain generated during bending or rolling.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a flexible substrate;
a plurality of conductive lines disposed on the flexible substrate;
a thin film transistor connected to the plurality of conductive lines; and
an organic light emitting element connected to the thin film transistor,
wherein:
as a curvature of an area of the flexible substrate increases, a width or a thickness of each of the conductive lines increases; and
the width or the thickness of each of the conductive lines at a first position is greater than the width or the thickness of each of the conductive lines at any other positions at which the curvature of the area of the flexible substrate is less than the curvature of the area of the flexible substrate at the first position.

2. The display device of claim 1, wherein, as a strain that an area of the flexible substrate receives increases, a width or a thickness of each of the conductive lines increases.

3. The display device of claim 2, wherein the strain is in a range from about 0.2% to about 3%.

4. The display device of claim 1, wherein at least one of the width and the thickness of each of the conductive lines has a variation in a range from about 0.2% to about 3%.

5. The display device of claim 1, wherein each of the conductive lines comprises a gate line, a data line, or a common power line.

6. The display device of claim 1, further comprising a touch sensor unit disposed on the display panel,
wherein the touch sensor unit comprises:
a plurality of first sensing electrodes and a plurality of second sensing electrodes; and
a first connection line and a second connection line connecting the first sensing electrodes and the second sensing electrodes.

7. The display device of claim 6, wherein, as a curvature of an area of the flexible substrate increases, a width or a thickness of each of the first connection line and the second connection line increases.

8. The display device of claim 7, wherein at least one of the width and the thickness of each of the first connection line and the second connection line has a variation in a range from about 0.2% to about 3%.

9. The display device of claim 6, wherein, as a curvature of an area of the flexible substrate increases, a width of each of the first sensing electrode and the second sensing electrode increases.

10. The display device of claim 9, wherein the width of each of the first sensing electrode and the second sensing electrode has a variation in a range from about 0.2% to about 3%.

* * * * *